United States Patent
Yoshikawa et al.

(10) Patent No.: US 7,924,607 B2
(45) Date of Patent: Apr. 12, 2011

(54) MAGNETORESISTANCE EFFECT ELEMENT AND MAGNETORESISTIVE RANDOM ACCESS MEMORY USING THE SAME

(75) Inventors: Masatoshi Yoshikawa, Yokohama (JP); Eiji Kitagawa, Sagamihara (JP); Tadashi Kai, Tokyo (JP); Toshihiko Nagase, Sagamihara (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 553 days.

(21) Appl. No.: 12/047,749

(22) Filed: Mar. 13, 2008

(65) Prior Publication Data

US 2008/0253174 A1  Oct. 16, 2008

(30) Foreign Application Priority Data

Mar. 30, 2007  (JP) ................ 2007-094625

(51) Int. Cl.
  *G11C 11/00*  (2006.01)
(52) U.S. Cl. ......... 365/158; 365/148; 365/171; 977/935
(58) Field of Classification Search .......... 365/48, 365/55, 62, 66, 74, 78, 80–93, 100, 130, 365/131, 148, 158, 171–173, 209, 213, 225, 365/230.07, 232, 243.5; 216/22; 257/421, 257/E21.665; 438/3, 810–816, 817–825.1, 438/826; 977/933–935
See application file for complete search history.

(56) References Cited

U.S. PATENT DOCUMENTS

| | | | |
|---|---|---|---|
| 6,256,223 | B1 | 7/2001 | Sun |
| 2007/0096229 | A1* | 5/2007 | Yoshikawa et al. ........... 257/421 |
| 2007/0297220 | A1* | 12/2007 | Yoshikawa et al. ........... 365/158 |
| 2008/0088980 | A1* | 4/2008 | Kitagawa et al. ............. 360/313 |
| 2008/0112216 | A1* | 5/2008 | Ueda ............................. 365/158 |

FOREIGN PATENT DOCUMENTS

| | | |
|---|---|---|
| CN | 1503912 A | 6/2004 |
| CN | 1606093 A | 4/2005 |
| CN | 1938780 A | 3/2007 |
| JP | 10-2005-0078158 | 8/2005 |

(Continued)

OTHER PUBLICATIONS

J.C. Slonczewski, "Current-driven excitation of magnetic multilayers", Journal of Magnetism and Magnetic Materials, vol. 159, 1996, pp. L1-L7. U.S. Appl. No. 12/409,654, filed Mar. 24, 2009, Yoshikawa, et al.

G. Lauhoff, et al., "Ferrimagnetic T-MnAl/Co Superlattices on GaAs", Physical Review Letters, The American Physical Society, vol. 79, No. 26, Dec. 31, 1997, pp. 5290-5293.

(Continued)

*Primary Examiner* — Richard Elms
*Assistant Examiner* — Harry W Byrne
(74) *Attorney, Agent, or Firm* — Oblon, Spivak, McClelland, Maier & Neustadt, L.L.P.

(57) ABSTRACT

A magnetoresistive effect element includes a first magnetic layer, a second magnetic layer, and a first spacer layer. The first magnetic layer has an invariable magnetization direction. The second magnetic layer has a variable magnetization direction, and contains at least one element selected from Fe, Co, and Ni, at least one element selected from Ru, Rh, Pd, Ag, Re, Os, Ir, Pt, and Au, and at least one element selected from V, Cr, and Mn. The spacer layer is formed between the first magnetic layer and the second magnetic layer, and made of a nonmagnetic material. A bidirectional electric current flowing through the first magnetic layer, the spacer layer, and the second magnetic layer makes the magnetization direction of the second magnetic layer variable.

23 Claims, 8 Drawing Sheets

| | FOREIGN PATENT DOCUMENTS | |
|---|---|---|
| JP | 2006-19728 | 1/2006 |
| JP | 2006-80287 | 3/2006 |
| JP | 10-2006-0118013 | 11/2006 |
| JP | 2007-525839 | 9/2007 |
| WO | WO 2005/079528 A2 | 9/2005 |
| WO | WO 2006/133342 A2 | 12/2006 |

OTHER PUBLICATIONS

G. Lauhoff, et al., "Ferrimagnetic $_T$-MnAl/Co Superlattices on GaAs", Physical Review Letters, The American Physical Society, vol. 79, No. 26, Dec. 31, 1997, pp. 5290-5293.

* cited by examiner

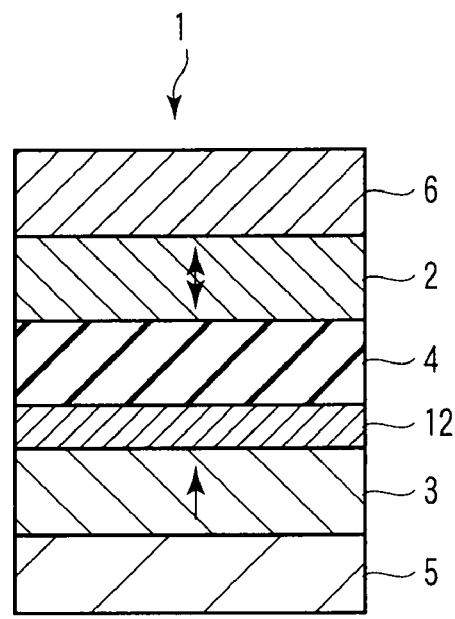
F I G. 3
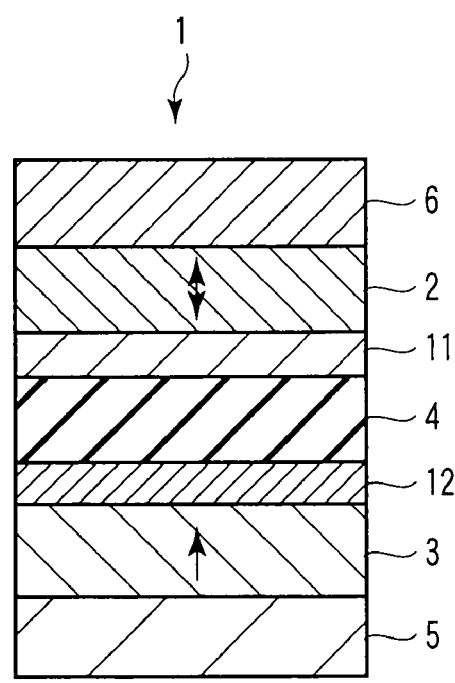
F I G. 4

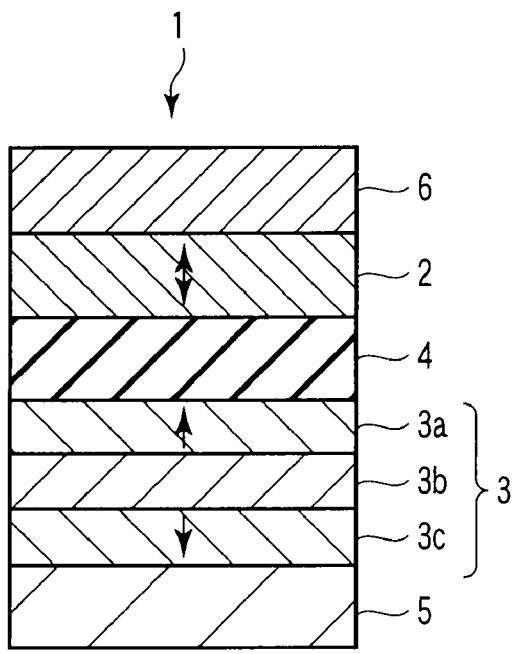
F I G. 10
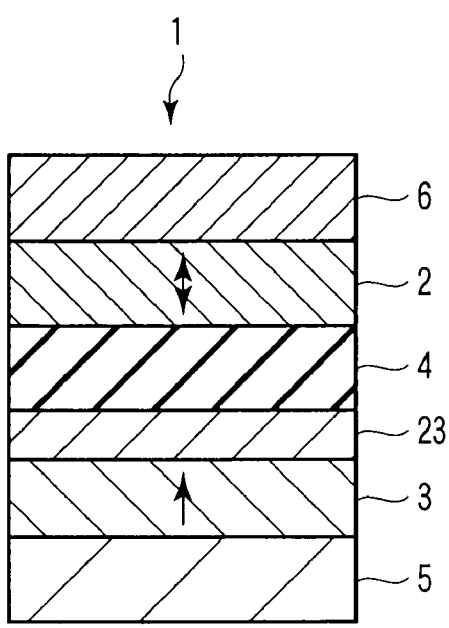
F I G. 11

MAGNETORESISTANCE EFFECT ELEMENT AND MAGNETORESISTIVE RANDOM ACCESS MEMORY USING THE SAME

CROSS-REFERENCE TO RELATED APPLICATIONS

This application is based upon and claims the benefit of priority from prior Japanese Patent Application No. 2007-094625, filed Mar. 30, 2007, the entire contents of which are incorporated herein by reference.

BACKGROUND OF THE INVENTION

1. Field of the Invention

The present invention relates to a magnetoresistive effect element and a magnetoresistive random access memory using the same and, more particularly, to a spin transfer torque writing type magnetoresistive effect element.

2. Description of the Related Art

Recently, many solid-state memories that record information on the basis of new principles have been proposed. Of these solid-state memories, a magnetoresistive random access memory (MRAM) using the tunnel magnetoresistive (TMR) effect is known as a solid-state magnetic memory. The MRAM uses a magnetoresistive effect element (TMR element) that achieves the tunneling magnetoresistive effect as a memory cell, and the memory cell stores information in accordance with the magnetization configuration of the TMR element.

The TMR element includes a magnetization variable layer and magnetization fixed layer. The resistance is low when the magnetization direction in the magnetization variable layer is parallel to that in the magnetization fixed layer, and high when the magnetization direction in the former layer is antiparallel to that in the latter layer. Information is stored by using this difference between the resistance states due to the magnetization configurations of the magnetization variable layer and the magnetization referenced layer.

A so-called current-induced magnetic field writing method is known as a method of writing information in the TMR element. This method changes the magnetization configuration of the TMR element by a magnetic field generated by an electric current flowing through an interconnection formed near the TMR element. If the size of the TMR element is decreased for high-density MRAMs, a coercive force Hc of the magnetization variable layer of the TMR element increases. In the magnetic field write type MRAM, therefore, an electric current in a write operation often increases as the size of the TMR element is decreased. This makes it difficult to achieve a small cell size for obtaining a large capacity exceeding 256 Mbits and a low writing electric current at the same time.

As a writing method of solving this problem, the spin transfer torque writing method using spin momentum transfer torque (STT) has been proposed (U.S. Pat. No. 6,256,233). This spin transfer torque writing method changes (reverses) the magnetization configuration of the TMR element by supplying an electric current perpendicularly to a direction in which films forming the TMR element oppose each other.

An electric current Ic necessary for spin transfer torque magnetization reversal is often defined by a current density Jc. Accordingly, as the area of a plane through which the electric current passes in the TMR element decreases, the injection electric current Ic for reversing magnetization also decreases. When writing information at a constant current density, the electric current Ic decreases as the TMR element size decreases. Therefore, the spin transfer torque writing method is in principle superior in scalability to the magnetic field write method.

Unfortunately, the following problem arises when implementing an MRAM by using the spin transfer torque writing method. That is, the electric current required for magnetization reversal is presently larger than an electric current value that can be generated by a selection transistor often used in the implementation of an MRAM. This practically makes it impossible to allow a device to operate as a memory by using the spin transfer torque writing method.

As described in C. Slonczewski, "Current-driven excitation of magnetic multilayers", "JOURNAL OF MAGNETISM AND MAGNETIC MATERIALS", 1996, vol. 159, pp. L1-L7, a reversing current for magnetization reversal by spin transfer torque effect generally depends upon saturation magnetization Ms of a magnetization free layer. Accordingly, it is important to decrease the saturation magnetization Ms for the magnetic switching in the magnetization free layer by spin transfer torque effect of a low electric current. When the saturation magnetization is decreased by using the present techniques, however, the thermal stability required for the data retention characteristics of a non-volatile memory also decreases.

BRIEF SUMMARY OF THE INVENTION

According to a first aspect of the invention, there is provided a magnetoresistive effect element comprising: a first magnetic layer having an invariable magnetization direction; a second magnetic layer having a variable magnetization direction, and containing at least one element selected from the group consisting of Fe, Co, and Ni, at least one element selected from the group consisting of Ru, Rh, Pd, Ag, Re, Os, Ir, Pt, and Au, and at least one element selected from the group consisting of V, Cr, and Mn; and a first spacer layer formed between the first magnetic layer and the second magnetic layer, and made of a nonmagnetic material. A bidirectional electric current flowing through the first magnetic layer, the first spacer layer, and the second magnetic layer makes the magnetization direction of the second magnetic layer variable.

According to a second aspect of the invention, there is provided a magnetoresistive effect element comprising: a first magnetic layer having an invariable magnetization direction; a second magnetic layer having a variable magnetization direction, and made of an MnAl alloy containing 30 (inclusive) to 70 (inclusive) at % of Mn, the second magnetic layer containing one of a ferromagnetic material and a ferrimagnetic material; and a first spacer layer formed between the first magnetic layer and the second magnetic layer, and made of a nonmagnetic material. A bidirectional electric current flowing through the first magnetic layer, the first spacer layer, and the second magnetic layer makes the magnetization direction of the second magnetic layer variable.

According to a third aspect of the invention, there is provided a magnetoresistive random access memory of the present invention according to the third aspect comprises a memory cell array including a plurality of memory cells each including the magnetoresistive effect element according to the first or second aspect as a memory element; and a current supply circuit configured to bidirectionally supply an electric current to the memory cell.

BRIEF DESCRIPTION OF THE SEVERAL VIEWS OF THE DRAWING

FIG. 3 is a sectional view showing still another example of the main parts of the MR element according to the first embodiment of the present invention;

FIG. 4 is a sectional view showing still another example of the main parts of the MR element according to the first embodiment of the present invention;

FIG. 10 is a sectional view showing still another example of the main parts of the MR element according to the first embodiment of the present invention;

FIG. 11 is a sectional view showing still another example of the main parts of the MR element according to the first embodiment of the present invention;

DETAILED DESCRIPTION OF THE INVENTION

Figure 1:
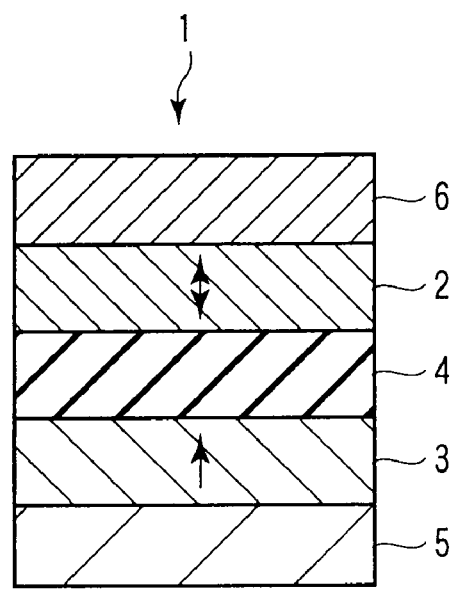
FIG. 1 is a sectional view showing an example of the main parts of an MR element according to a first embodiment of the present invention.

Embodiments of the present invention will be explained below with reference to the accompanying drawing. Note that in the following explanation, the same reference numerals denote constituent elements having almost the same functions and arrangements, and a repetitive explanation will be made only when necessary. Since, however, each figure is an exemplary view, it should be noted that the relationship between the thickness and the planar dimensions, the ratio of the thicknesses of layers, and the like are different from the actual ones. Accordingly, practical thicknesses and dimensions should be judged in consideration of the following explanation. Also, the individual figures naturally include portions having different dimensional relationships or ratios.

Note also that each embodiment to be presented below merely discloses an apparatus or method for embodying the technical idea of the present invention. Therefore, the technical idea of the present invention does not limit the materials, shapes, structures, arrangements, and the like of constituent parts to those described below. The technical idea of the present invention can be variously changed within the scope of the appended claims.

First Embodiment

The first embodiment is directed to an MR element.
(1) Structure of MR Element
FIG. 1 shows the main parts of the MR element according to the first embodiment of the present invention. FIG. 1 shows an MR element having a so-called single pin structure. Referring to FIG. 1, arrows indicate the magnetization directions. The MR element herein mentioned in this specification and the scope of claims is a general term of a GMR (Giant MagnetoResistance) element using a metal spacer layer, and a TMR (Tunneling MagnetoResistance) element using a semiconductor or insulator as a spacer layer. Although the following figures each illustrate the major components of the MR element, another layer may also be included as long as the arrangement shown in the figure is included.

An MR element 1 has an arrangement in which each layer takes one of two steady states in accordance with the direction of an electric current flowing through surfaces (film surfaces) through which individual layers oppose each other. The MR element 1 can store binary data by making the two steady states correspond to data "0" and "1". The MR element 1 changes the magnetization configuration by the spin transfer torque writing (spin transfer torque writing magnetization reversal) method, and stores information corresponding to the magnetization configuration.

As shown in FIG. 1, the MR element 1 has at least two magnetic layers 2 and 3, and a spacer layer 4 formed between the magnetic layers 2 and 3. The magnetic layer 2 has the easy magnetization axis in a direction extending through the film surfaces, typically, in a direction perpendicular to the film surfaces, and rotates along a plane crossing the film surfaces. The magnetic layer 2 has a variable magnetization direction. The magnetic layer 2 will be referred to as a free layer (magnetization free layer, magnetization variable layer, or recording layer) hereinafter. The properties of the free layer 2 will be described in more detail later. Magnetization in the direction extending through the film surfaces will be referred to as perpendicular magnetization hereinafter.

In the magnetic layer 3, magnetization is fixed in the direction crossing the film surfaces, typically, in the direction perpendicular to the film surfaces. The magnetic layer 3 may also have a coercive force larger than that of the free layer 2. The magnetic layer 3 has an invariable magnetization direction. The magnetic layer 3 will be referred to as a pinned layer (fixed layer, magnetization fixed layer, reference layer, magnetization reference layer, base layer, or magnetization base layer) hereinafter. Typically, the direction of the easy magnetization axis of the free layer 2 is equal to the magnetization direction in the pinned layer 3. The properties of the pinned layer 3 will be described in more detail later. Note that the magnetization direction in the pinned layer 3 is upward in FIG. 1, but this direction may also be downward.

The spacer layer 4 is made of, e.g., a nonmagnetic metal, nonmagnetic semiconductor, or insulating film. The properties of the spacer layer 4 will be described in more detail later.

The MR element 1 is used in the so-called spin transfer torque writing method. That is, when writing data, an electric current is supplied from the pinned layer 3 to the free layer 2, or from the free layer 2 to the pinned layer 3, in the direction extending through the film surfaces (typically, in the direction perpendicular to the film surfaces). As a consequence, electrons storing spin information are injected into the free layer 2 from the pinned layer 3. The spin angular momentum of the injected electrons is transferred to electrons in the free layer 2 in accordance with the law of spin angular momentum conservation. This reverses magnetization in the free layer 2.

FIG. 1 shows a so-called bottom pin structure in which the free layer 2 is formed on the spacer layer 4, and the pinned layer 3 is formed below the spacer layer 4. However, it is also possible to use a so-called top pin structure in which the free layer 2 is formed below the spacer layer 4, and the pinned layer 3 is formed on the spacer layer 4.

An underlying layer 5 may also be formed below the pinned layer 3. The underlying layer 5 is used to control the crystal orientation and the crystallinity such as the crystal grain size of each layer above the pinned layer 3.

Furthermore, a cap layer 6 may also be formed on the free layer 2. The cap layer 6 functions as a protective layer, and protects the free layer 2 in the bottom pin layer structure or the pinned layer 3 in the top pin layer structure from oxidation. The cap layer 6 also has a function of suppressing the diffusion of atoms (molecules) during post-annealing. In addition, if the free layer 2 or pinned layer 3 causes a phase change, the cap layer 6 sometimes has an effect of assisting the phase change energy when misfit of the lattice is taken into consideration.

An interface layer (to be described later) is not inserted into the structure shown in FIG. 1. The structure shown in FIG. 1 can be used when the free layer 2 and pinned layer 3 achieve a high TMR, or have a spin polarization ratio sufficient to increase the spin transfer torque efficiency.

Figure 2:
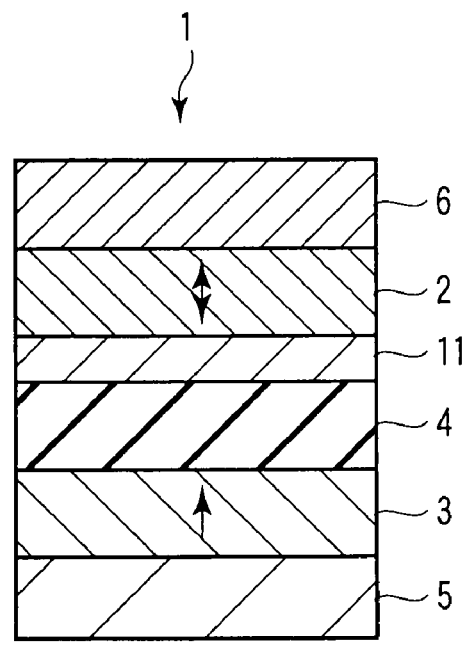
FIG. 2 is a sectional view showing another example of the main parts of the MR element according to the first embodiment of the present invention.

As shown in FIG. 2, an interface layer 11 may also be inserted between the free layer 2 and spacer layer 4. The interface layer 11 and interface layers 12 and 13 (to be described later) are made of a ferromagnetic material. The properties of the interface layers 11 to 13 will be described in more detail later. The interface layer 11 also has an effect of reducing the crystal lattice misfit in the interface between the spacer layer 4 and free layer 2. That is, the interface layer 11 has the function of a buffer layer for the free layer 2 or pinned layer 3 on the spacer layer 4.

As shown in FIG. 3, the interface layer 12 may also be inserted between the pinned layer 3 and spacer layer 4. The interface layer 12 is inserted in order to increase the TMR ratio of the MR element 1, increase the polarization ratio on the spin supply side, and increase the spin transfer torque efficiency. The interface layer 12 also has an effect of reducing the crystal lattice misfit in the interface between the spacer layer 4 and pinned layer 3. That is, the interface layer 12 has the function of a buffer layer for the spacer layer 4 on the pinned layer 3 or free layer 2 in accordance with whether the device has the bottom pin structure or top pin structure. The interface layer 12 is particularly important when using the crystalline spacer layer 4.

As shown in FIG. 4, the interface layers 11 and 12 may also be respectively inserted between the free layer 2 and spacer layer 4 and between the pinned layer 3 and spacer layer 4. This structure achieves both the effects described in the explanation of FIGS. 2 and 3.

Figure 5:
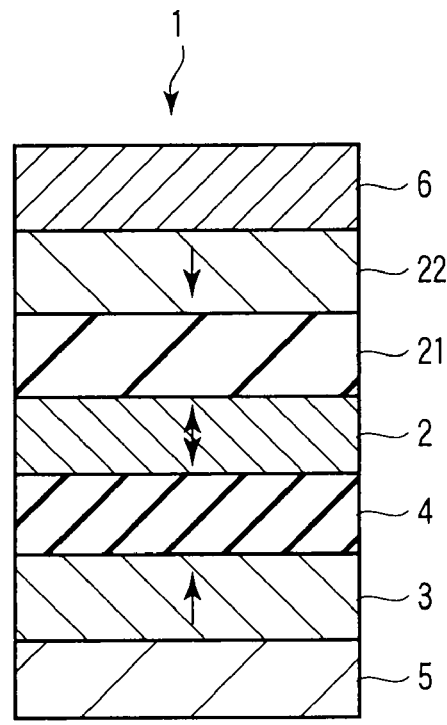
FIG. 5 is a sectional view showing still another example of the main parts of the MR element according to the first embodiment of the present invention.

The MR element 1 can also have a so-called dual pin structure. FIG. 5 shows the main parts of the MR element according to the embodiment of the present invention, i.e., shows a so-called dual pin structure MR element.

As shown in FIG. 5, a spacer layer 21 and pinned layer 22 are additionally formed on the surface of the free layer 2 away from the surface opposing the spacer layer 4. The cap layer 6 is positioned on the pinned layer 22. The pinned layer 22 has perpendicular magnetization like the pinned layer 3. The material of the spacer layer 21 can be selected from the same materials as used in the spacer layer 4. The material of the pinned layer 22 can be selected from the same materials as used in the pinned layer 3. The magnetization directions in the pinned layers 3 and 22 are antiparallel.

In spin transfer torque magnetization reversal, the dual pin structure has two electron injection sources. Since this raises the electron injection efficiency, an effect of decreasing a reversing current is obtained.

In the dual pin structure, one of the spacer layers 4 and 21 need only have a tunnel barrier function in order to achieve the TMR. That is, one of the spacer layers 4 and 21 is made of an insulator or semiconductor. One of the spacer layers 4 and 21 may also be made of a metal such as Cu, Ag, Au, Pt, Pd, Al, or Mg. If both the spacer layers 4 and 21 are tunnel barrier layers, the spacer layers 4 and 21 need only have a resistance difference. In this case, the difference in sheet resistance (R·A (R represents a resistance value, and A represents an area)) is preferably two to five times. This makes it possible to maximally use the effect of spin accumulation.

Figure 6:
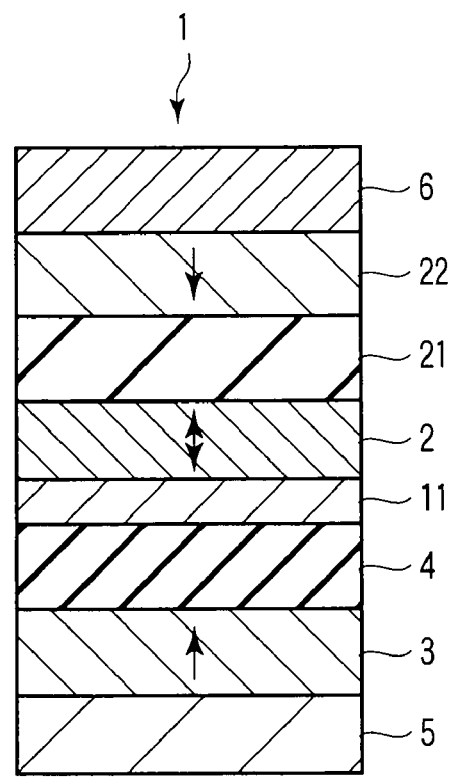
FIG. 6 is a sectional view showing still another example of the main parts of the MR element according to the first embodiment of the present invention.
Figure 7:
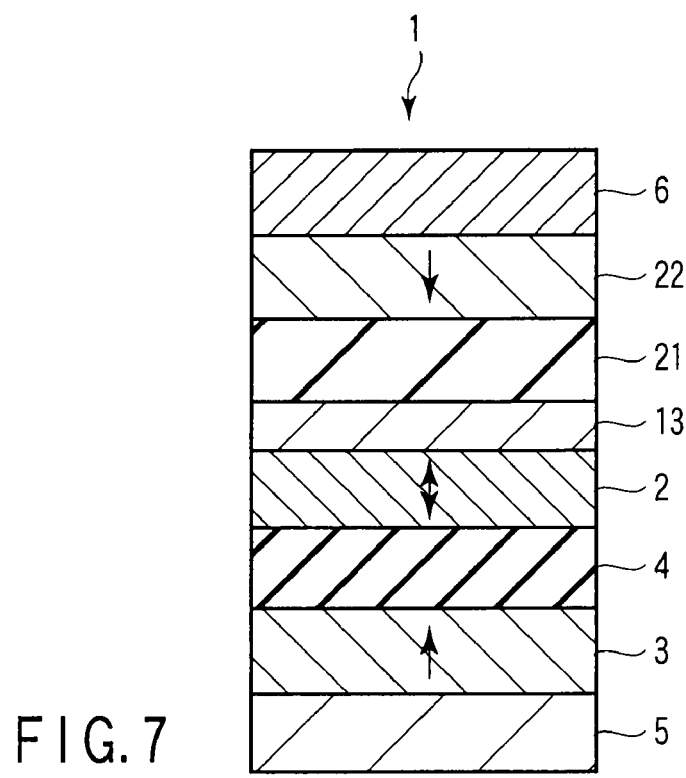
FIG. 7 is a sectional view showing still another example of the main parts of the MR element according to the first embodiment of the present invention.
Figure 8:
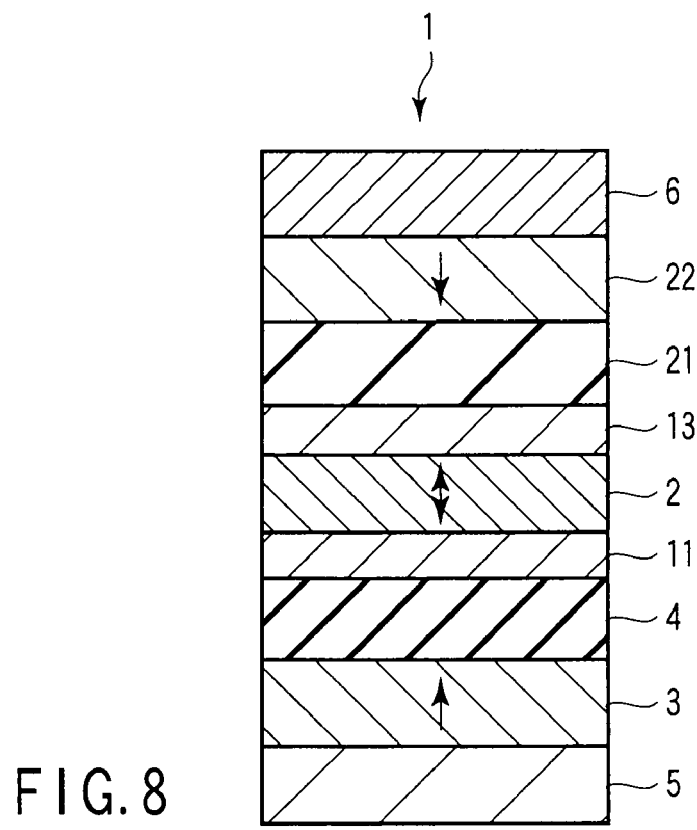
FIG. 8 is a sectional view showing still another example of the main parts of the MR element according to the first embodiment of the present invention.

As shown in FIG. 6, similar to FIG. 2, the interface layer 11 may also be inserted between the free layer 2 and spacer layer 4. As shown in FIG. 7, the interface layer 13 may also be inserted between the free layer 2 and spacer layer 21. As shown in FIG. 8, the interface layers 11 and 13 may also be respectively inserted between the free layer 2 and spacer layer 4 and between the free layer 2 and spacer layer 21. Furthermore, similar to FIG. 3, the interface layer 12 may also be inserted between the pinned layer 3 and spacer layer 4 or/and between the pinned layer 22 and spacer layer 21 in the dual pin structure. In the dual pin structure, the interface layers 11, 12, and 13 may also be inserted between the free layer 2 and spacer layer 4, between the free layer 2 and spacer layer 21, between the pinned layer 3 and spacer layer 4, and between the pinned layer 22 and spacer layer 21.

Note that this specification mainly refers to an MR element using a magnetic layer having perpendicular magnetization. However, the present invention is also applicable to an MR element using a magnetic layer having longitudinal magnetization (magnetization in a direction parallel to the film surfaces).

(2) Free Layer

The following advantage is obtained because the free layer 2 has perpendicular magnetization. That is, a perpendicular magnetization film uses the crystal magnetic anisotropic energy as the magnetic anisotropic energy necessary to hold information. This eliminates limitations on the shape of an MR element using a perpendicular magnetization film, unlike an MR element using a longitudinal magnetization film. Accordingly, the aspect ratio of the MR element can be decreased to 1. More specifically, letting F be the feature size in the fabrication process of a magnetic memory device, the MR element can be formed with a size of $4F^2$. Since each memory cell of an MRAM comprises one MR element and one selection transistor, the shape of the selection transistor defines the cell size. Even when an MR element having a size of $4F^2$ is formed, therefore, the selection transistor has a size of $6F^2$, so an MRAM having a cell size of $6F^2$ is formed.

(2-1) Properties Required of Free Layer

In order for a certain layer to have perpendicular magnetization, the layer must have a high crystal magnetic anisotropic energy Ku, and the perpendicular magnetization configuration is unstable unless an effective anisotropic energy Ke satisfies $$Ke=Ku-2\pi Ms^2>0 \quad \text{(formula 1)}$$

where Ms: saturation magnetization

To form a stable perpendicular magnetization film, therefore, it is important to ensure an appropriate effective anisotropic energy Ke. This is presumably accomplished by increasing the crystal magnetic anisotropic energy Ku or reducing the saturation magnetization Ms. The crystal magnetic anisotropic energy Ku cannot be unlimitedly increased because it largely depends upon the properties of the material.

Also, an activation energy Ea necessary for the free layer 2 to hold information is represented by $$Ea = Ke \cdot V_M$$

where Ke: effective magnetic anisotropic energy
$V_M$: effective magnetization volume
The effective magnetic anisotropic energy Ke of a perpendicular magnetization film is represented by $$Ke = Ku - 2\pi Ms^2$$

where Ms represents the saturation magnetization.

As described above, the activation energy Ea depends on the effective anisotropic energy Ke and hence on the crystal magnetic anisotropic energy Ku. Accordingly, if the crystal magnetic anisotropic energy Ku is excessively increased to form a stable perpendicular magnetization film, the activation energy Ea required to hold information may excessively increase.

From the above limitation, it is important to reduce the saturation magnetization Ms in order to form a stable perpendicular magnetization film, i.e., a perpendicular magnetization film having a high thermal resistance.

Generally, a critical current (magnetization reversing current) Ic necessary for spin transfer torque magnetization reversal in a certain layer is $$Ic \propto \alpha \cdot \eta \cdot Ms \cdot \Delta \qquad \text{(formula 2)}$$

where
$\alpha$: damping constant
$\eta$: spin transfer torque efficiency coefficient
$\Delta$: thermal stability index
The thermal stability index $\Delta$ is $$\Delta = Ke \cdot V_M / (k_b \cdot T)$$

where
$V_M$: effective magnetization volume
$k_b$: Boltzmann's constant
T: absolute temperature
The thermal stability index $\Delta$ is an index of the capability of holding information recorded in a certain layer. Accordingly, it is possible to decrease the magnetization reversing current and increase the information holding capability by reducing the saturation magnetization Ms while maintaining the thermal stability index $\Delta$.

From the foregoing, the free layer 2 is preferably made of a material having a low crystal magnetic anisotropic energy Ku and a small saturation magnetization Ms while maintaining a high effective magnetic anisotropic energy within a positive range so as to hold perpendicular magnetization and a high thermal stability index.

(2-2) Practical Examples of Free Layer

(2-2-1) Properties

As described above, in order for a certain layer to have perpendicular magnetization, reverse magnetization with a small electric current, and have high information holding capability, the layer is favorably made of a material having a low crystal magnetic anisotropic energy Ku and a small saturation magnetization Ms so that the activation energy Ea can be suppressed, while maintaining a high effective magnetic anisotropic energy Ke within a positive range. A material meeting this requirement is as follows.

The free layer 2 of the MR element 1 according to the first embodiment is made of a magnetic alloy containing at least one element A selected from Fe, Co, and Ni, at least one element B selected from Ru, Rh, Pd, Ag, Re, Os, Ir, Pt, and Au, and at least one element C selected from V, Cr, and Mn.

The element B (Ru, Rh, Pd, Ag, Re, Os, Ir, Pt, or Au) has many 4d and 5d electrons. An element having many 3d, 4d, and 5d electrons has a high crystal magnetic anisotropic energy. Therefore, an alloy (to be referred to as an AB alloy hereinafter) made of the elements A and B has a high crystal magnetic anisotropic energy Ku and a high positive effective magnetic anisotropic energy Ke. Note that the AB alloy is a ferromagnetic alloy. The composition of the element B is preferably 30 (inclusive) to 70 (inclusive) at %. This is so because in this composition region, the alloy can have an $L1_0$ ordered structure phase having a high crystal magnetic anisotropic energy Ku of $1 \times 10^6$ erg/cc or more, although details will be explained below.

Examples of the AB alloy showing perpendicular magnetization characteristics particularly at room temperature are FePt alloy, FePd alloy, CoPt alloy, CoPd alloy, and NiPt alloy. The condition of the perpendicular magnetic anisotropy is effective magnetic anisotropic energy Ke>0. These alloys have the $L1_0$ type (CuAu type) ordered structure phase having a face-centered tetragonal (FCT) structure as a basic lattice when the composition ratio of the element A is 40 to 60 at %. The $L1_0$ ordered structure phase basically has the FCT structure as a basic structure, and the relationships between lattice constants (a, b, c) of a unit cell are a=b, a≠c, and a>c. Also, the $L1_0$ ordered structure phase is formed even when the composition ratio of the element A is 30 to 70 at %. In this case, the volume ratio of the $L1_0$ structure layer is 50% or more. In the $L1_0$ ordered structure layer, an A plane as a (001) plane formed by the element A and a B plane as a (001) plane formed by the element B are alternately stacked like the A plane, B plane, A plane, B plane, A plane, . . . , in a [001] direction. In the $L1_0$ ordered phase, forbidden reflection caused by ordering is observed by X-ray diffraction or electron beam diffraction. That is, in addition to a diffracted image caused by a (002) plane found in the FCT structure, a diffracted image caused by the (001) plane is obtained.

The $L1_0$ structure having the ABABAB stacked structure described above can also be artificially formed by sputtering or MBE (Molecular Beam Epitaxy) by using an artificial lattice having a number of periods. Accordingly, this structure need not always exist as a stable phase in a binary or ternary phase state diagram.

Also, an $L1_2$ ordered structure phase represented by $AB_3$ is sometimes locally formed when the composition ratio of the element A is 30 to 50 at %. Furthermore, an $L1_2$ ordered structure phase represented by $A_3B$ is sometimes locally formed when the composition ratio of the element A is 50 to 70 at %.

The AB alloy having the $L1_0$ structure has a high uniaxial crystal magnetic anisotropic energy Ku in the [001] direction, and perpendicular magnetization becomes stable when the (001) plane is preferentially aligned parallel to the film surfaces. However, the binary AB alloy having the $L1_0$ ordered structure phase has a large saturation magnetization Ms of about 1,000 emu/cc. Therefore, the saturation magnetization Ms must be decreased in order to decrease the magnetization reversing current Ic. When decreasing the saturation magnetization Ms, the crystal magnetic anisotropic energy Ku must be kept high enough to maintain a high positive effective magnetic anisotropic energy (Ke>0), and kept low enough to decrease the activation energy Ea.

When a nonmagnetic element is added to a ferromagnetic material, the saturation magnetization Ms and crystal magnetic anisotropic energy Ku generally decrease almost proportionally to the addition amount. However, the decrease in crystal magnetic anisotropic energy Ku is larger than that in saturation magnetization Ms. As the addition amount of the nonmagnetic element increases, therefore, as indicated by formula (I), effective magnetic anisotropic energy Ke>0 cannot be maintained any longer, and this makes perpendicular magnetization very difficult to maintain.

Accordingly, the AB alloy having the $L1_0$ structure as a ferromagnetic material need only be changed into a ferrimagnetic material. An example of a method of forming the ferrimagnetic material is to add an element that behaves antiferromagnetically to the ferromagnetic material. For this purpose, the element C is added to the AB alloy. The element C preferably forms a solid solution that substitutes the element A. As described previously, examples of the element C that behaves antiferromagnetically are V, Cr, and Mn. Changing the AB alloy into the ferrimagnetic material makes it possible to decrease the crystal magnetic anisotropic energy Ku and effective saturation magnetization Ms (net Ms) while maintaining a high positive effective anisotropic energy Ke. When substituting the element A with the element C, the element C must be added such that the net saturation magnetization Ms is 0 or more. A composition with which the net saturation magnetization Ms is 0 is called a compensation point composition. In the AB alloy having the $L1_0$ structure of the present invention, the substitution amount of the element C is favorably less than 25% of the overall amount. That is, the substitution amount is a maximum when the atomic composition ratio of the element A to the element C is A:C=50:50 (at %), in other words, when the composition ratio of the element C to the element A is 1 or less (except for 0). If this ratio is exceeded, the ABC alloy changes into an antiferromagnetic alloy, and the TMR ratio abruptly decreases.

The element B is selected so that the material made of the elements A and C has a high crystal magnetic anisotropic energy Ku while maintaining a ferri-magnetization arrangement, and can maintain a high positive effective magnetic anisotropic energy Ke. The element B has many 4d and 5d electrons. Although there are other examples of this element, they have no empty level or very few empty levels and hence do not help increase the crystal magnetic anisotropic energy Ku of the material made of the elements A and C. Therefore, this embodiment uses the elements B described above. However, the element B having 5d electrons and containing no 4f element is preferable to decrease the damping constant, i.e., reduce the spin transfer torque magnetization reversing current. From this point of view, Ru, Rh, Pd, and Ag are favorable as the element B.

As described above, the free layer 2 is made of the material containing the elements A, B, and C. Since the free layer 2 is made of the alloy of the elements A and B, the effective magnetic anisotropic energy Ke of the free layer 2 can be kept high within a positive range. Simultaneously, forming the ferrimagnetic material by the elements A and C makes it possible to implement the free layer 2 having a low crystal magnetic anisotropic energy Ku and a small saturation magnetization Ms while keeping the effective magnetic anisotropic energy Ke high within a positive range. Consequently, it is possible to decrease the magnetization reversing current Ic and activation energy Ea while holding the state in which perpendicular magnetization in the free layer 2 can be readily maintained.

This embodiment uses a ferrimagnetic material of a 3d transition element as the free layer 2. It is also possible to form a ferrimagnetic material by using a rare earth element. The use of the rare earth element is desirable from the viewpoint of control of the saturation magnetization Ms, since the saturation magnetization Ms of the ferrimagnetic material can be controlled in both positive and negative ranges. However, the ferrimagnetic material using the rare earth element, e.g., an FeCo-RE material (RE is the rare earth element) has an amorphous structure and changes into a ferromagnetic material if this amorphous structure collapses. Also, the rare earth element has a very low corrosion resistance. Thus, it is difficult to use the rare earth element as the free layer 2. Furthermore, in the MR element for spin transfer torque writing, the saturation magnetization Ms need only decrease to 0 at most, i.e., need not have a negative value. In consideration of these factors, this embodiment implements the ferrimagnetic metal by using the elements A and C.

An MnAl alloy may also be used as the material of the free layer 2. This MnAl alloy can also implement the free layer 2 capable of decreasing the crystal magnetic anisotropic energy Ku and saturation magnetization Ms while keeping the effective magnetic anisotropic energy Ke high within a positive range.

As a method of obtaining the ferromagnetic metal having perpendicular magnetization, it is also possible to add a ferromagnetic element Fe, Co, or Ni to an antiferromagnetic alloy made of a noble metal element and 3d transition metal element. Examples of the antiferromagnetic alloy made of a noble metal element and 3d transition metal element are an RhFe alloy, PdMn alloy, PtMn alloy, PtCr alloy, RhMn alloy, AuMn alloy, AuCr alloy, CrMn alloy, PdCr alloy, RuCr alloy, and ReCr alloy. These antiferromagnetic binary alloys have a composition ratio of about 1:1. However, this value is not strict, and the atomic composition of Rh, Pt, Pd, Au, Re, or Ru that can be contained is 40 to 60 at %.

Of these alloys, the RhMn alloy, AuMn alloy, AuCr alloy, CrMn alloy, PdCr alloy, RuCr alloy, ReCr alloy, or the like has a low crystal magnetic anisotropic energy Ku, and hence is highly likely to exhibit no perpendicular magnetic anisotropy. The crystal magnetic anisotropic energy Ku of any of these alloys can be raised by adding Pt.

XMCD can be used to identify the ferromagnetic material. XMCD is an abbreviation of X-ray Magnetic Circular Dichroism. When the elements A, B, and C have magnetism, a magnetization response curve of each element can be obtained by XMCD. Since the method can decompose the magnetic characteristics of the contained elements, the ferrimagnetic material can be identified if the response of a magnetic field changes from one element to another.

Also, the free layer 2 can have the following plane relationship and orientation relationship. That is, a layer in which the c axis of the $L1_0$ ordered structure is perpendicular to the film surfaces can be formed by growing crystals on an oxide layer having an NaCl structure, so as to have Plane relationship: NaCl structure oxide (100)//$L1_0$ structure alloy (001)

Orientation relationship: NaCl structure oxide [100]//$L1_0$ structure alloy [100]

"//" means "parallel". As will be described later, crystals can be grown to have the above-mentioned plane relationship and orientation relationship on an oxide layer having an NaCl structure usable as the spacer layer 4. This achieves stabler perpendicular magnetization.

(2-2-2) Example (FePt Alloy)

As a practical example, the addition of Mn to an FePt alloy film will be explained below.

The FePt alloy has as its main structure the $L1_0$ structure when the composition ratio of Fe is about 50 at % (30 to 70 at %). If the composition ratio of Fe is higher than that of Pt, an $L1_2$ structure alloy having an $Fe_3Pt$ composition is often partially formed. If the composition ratio of Pt is higher than that of Fe, an $L1_2$ structure alloy having an $FePt_3$ composition is often partially formed.

The FePt alloy having the $L1_0$ structure is an ordered phase alloy having an FCT lattice in which a=0.385 nm±0.005 nm, c=0.371 nm±0.005 nm, and c/a≈0.96. The FePt alloy having the $L1_0$ structure has a saturation magnetization Ms of 800 emu/cc and crystal magnetic anisotropic energy Ku>1×10$^7$ erg/cc, and is an ideal high-Ku film.

The crystal magnetic anisotropic energy Ku and saturation magnetization Ms can be decreased by adding V, Cr, or Mn to the FePt alloy. V, Cr, or Mn is added to the Fe site by substitution. Substituted V, Cr, or Mn has a magnetic moment, but has a magnetization direction antiparallel to that of Fe. As a consequence, the overall FePt film to which V, Cr, or Mn is added becomes a ferrimagnetic material. This applies to the case where Pt is partially or entirely substituted with Pd.

Figure 9:
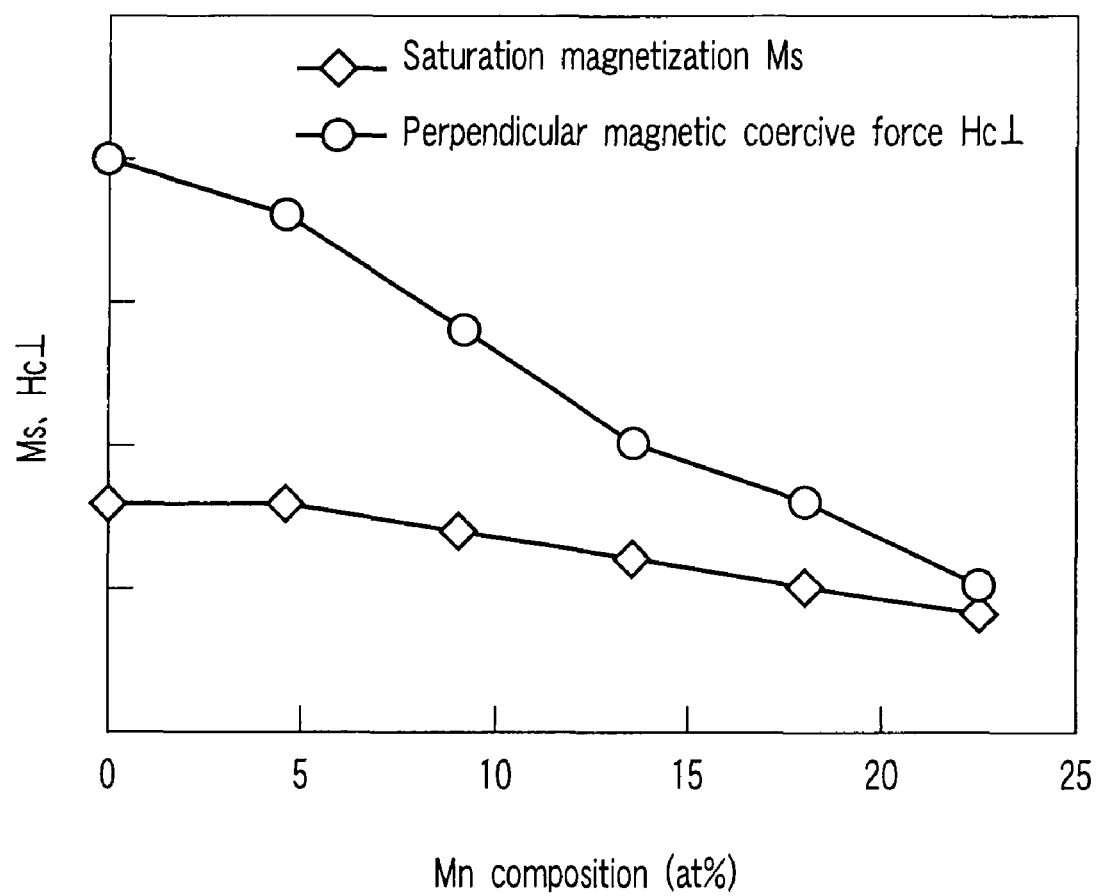
FIG. 9 is a graph showing the relationship between the amount of Mn added to an FePt film having an $L1_0$ structure, the saturation magnetization, and the perpendicular magnetization coercive force.

FIG. 9 shows the relationship between the amount of Mn added to a 5-nm thick FePt film having the $L1_0$ structure, the saturation magnetization Ms, and a perpendicular magnetization coercive force Hc⊥. Until the composition ratio of Mn atoms in the FeMnPt film was 25 at %, i.e., until the ratio of substitution to Fe was about 50%, it was possible to reduce the crystal magnetic anisotropic energy Ku and saturation magnetization Ms while maintaining the perpendicular magnetization characteristics.

The saturation magnetization Ms reduced in accordance with the addition amount of Mn, and a perpendicular saturation magnetization Ms of about 400 emu/cc was obtained when the addition amount of Mn was about 25 at %. In addition, when a 1-nm thick interface layer 11 made of Fe and a free layer 2 made of the FeMnPt alloy film were formed on a spacer layer 4 made of MgO, the free layer 2 was found to have perpendicular magnetization.

(2-2-3) Example (MnAl Alloy)

An MnAl alloy will be explained below as another practical example.

The MnAl alloy has the $L1_0$ structure ordered phase when the composition ratio of Mn is about 30 to 70 at %. The composition ratio of Mn is preferably 40 to 60 at % in order to form the $L1_0$ structure ordered phase more stably. The MnAl alloy has a saturation magnetization Ms of 100 emu/cc or less, and a high crystal magnetic anisotropic energy Ku of 5×10$^5$ erg/cc or more. The bulk Curie point is about 645K. This phase is called a τ phase or ε' phase on a phase diagram. Assuming that a unit cell has the FCT structure, a=0.394 nm, c=0.358 nm, and c/a=0.908.

The MnAl alloy having the $L1_0$ structure is a ferromagnetic material when the composition ratio of Mn is 50 at %. If the composition ratio of Mn increases, the substitution of Mn to the Al site occurs, so Mn in the Al site takes a spin arrangement antiparallel to that of Mn in the Mn site. Consequently, this MnAl alloy changes into a ferrimagnetic material.

Even when the atomic composition of Al is 50 at % or more, $Mn_{50}Al_{50}$ (at %) is effectively diluted with Al. Accordingly, the crystal magnetic anisotropic energy Ku simply decreases, and the saturation magnetization Ms decreases at the same time. This makes it necessary to deposit the MnAl ordered phase having the $L1_0$ structure in order to maintain a high crystal magnetic anisotropic energy Ku. From this point of view, the atomic composition of Al is preferably 70 at % or less in order to deposit the MnAl ordered phase having the $L1_0$ structure.

The MnAl alloy having the $L1_0$ structure has a high crystal magnetic anisotropic energy Ku with a low saturation magnetization Ms, and hence has a high activation energy Ea. Therefore, a third element X and fourth element Y are added to adjust the activation energy Ea to a proper value. The third element X also has an effect of increasing the TMR ratio by increasing the polarization ratio of the MnAl alloy. At the same time, the third element X is an additive element for increasing the saturation magnetization Ms and decreasing the activation energy Ea.

Examples of the third element X are Fe, Co, and Ni. The Fe, Co, or Ni element is substitutionally placed in the Mn site. Since this forms MnXAl, the saturation magnetization Ms increases. This makes it possible to decrease an effective perpendicular magnetization crystal magnetic anisotropic energy Ku-effect, thereby decreasing the activation energy Ea.

Ku-effect is represented by $$Ku\text{-effect} = Ku - 2\pi Ms^2$$

The third element X substitutes the Mn site, and the substitution amount is favorably 1 or less (except for 0) as the atomic composition ratio of the element X to Mn. This is so because the saturation magnetization Ms presumably abruptly increases if the atomic composition ratio of Fe exceeds 1.

The addition amount of the third element X also depends upon the addition amount of the fourth element Y within the above range. When increasing the saturation magnetization Ms, it is necessary to ensure effective magnetic anisotropic energy Ke>0 in order to maintain the perpendicular magnetization characteristics. To maintain an effective perpendicular magnetization crystal magnetic anisotropic energy Ku-effect of 0 or more while achieving a high TMR by adding the third element X, the crystal magnetic anisotropic energy Ku must be increased in some cases in accordance with the increase in saturation magnetization Ms caused by the addition of the third element X. In this case, it is necessary to add Ru, Rh, Pd, Ag, Re, Os, Ir, Pt, or Au as the fourth element Y. To improve the effect of increasing the crystal magnetic anisotropic energy Ku, Pt and Pd are favorable additive elements. Therefore, Pt or Pd is preferably added if possible. The fourth element Y has an effect of increasing the crystal magnetic anisotropic energy Ku by interacting with the third element X and Mn. The addition amount of the fourth element Y depends on that of the third element X. However, the atomic composition ratio to Al is preferably 1 or less when the MnAl alloy is the base material.

Also, crystals of the MnAl alloy can be grown with the following plane relationship and orientation relationship on an oxide layer having the NaCl structure.

Plane relationship: NaCl structure oxide (100)//$L1_0$ structure MnAl alloy (001)

Orientation relationship: NaCl structure oxide [100]//$L1_0$ structure MnAl alloy [100]

When the MnAl alloy is formed in accordance with this rule, the c axis of MnAl having the $L1_0$ structure crystal can be made perpendicular to the film surfaces, so more stable perpendicular magnetization can be achieved. For example, when the MnAl alloy is grown on a (100) plane of MgO by preferentially orienting a (100) plane, the lattice misfit amount is very small.

To achieve a high TMR ratio, it is favorable to insert an interface layer (to be described later). Practical example is a structure in which a 2-nm thick interface layer 11 made of Fe and a 5-nm thick free layer 2 made of MnAl are stacked on a spacer layer 4 made of MgO.

(3) Spacer Layer

The spacer layer will be explained in more detail below. In the following explanation, the spacer layer 4 includes the spacer layer 21.

As the material of the spacer layer 4, an oxide having the NaCl structure is more favorable than an $AlO_x$ oxide having the conventional amorphous structure. Examples of the oxide having the NaCl structure are MgO, CaO, SrO, TiO, VO, and NbO. These oxides have the NaCl structure as a stable phase. Crystals of these NaCl structure oxides are readily grown, by using a (100) plane as a preferentially oriented plane, on, e.g., an amorphous CoFeNiB alloy mainly containing Fe, Co, and Ni, on an FeCoNi alloy or monoelement metal having the BCC (Body-Centered Cubic) structure and a (100) preferentially oriented plane, or on a (001) plane of a layer having the FCT structure. A (100) plane can be preferentially oriented very easily especially on a CoFe amorphous alloy to which B, C, or N is added.

The lattice constants of the above oxides are as follows.
MgO: 0.42112 nm
CaO: 0.48105 nm
SrO: 0.51602 nm
TiO: 0.41766 nm
VO: 0.4062 nm
NbO: 0.42101 nm Since the lattice expands or contracts, the lattice constants described above have an error of about ±0.01 nm in actual X-ray diffraction constant measurements.

On the oxide layer preferentially oriented on a (100) plane, the $L1_0$ structure layer has favorable lattice matching properties, i.e., has a misfit of 10% or less in the case of (001) plane preferred orientation.

When the magnetization directions in the free layer 2 and pinned layer 3 are antiparallel, a spin-polarized Δ1 band causes tunnel conduction, so only majority spin electrons can contribute to the conduction. As a consequence, the MR element 1 lowers conductivity G and increases the resistance value. By contrast, when the magnetization directions in the free layer 2 and pinned layer 3 are parallel, a Δ5 band that is not spin-polarized dominates the conduction, so the MR element 1 raises the conductivity G and decreases the resistance value. Accordingly, the formation of the Δ1 band is the key to achieve a high TMR. To form the Δ1 band, the (100) plane of the spacer layer 4 made of the oxide having the NaCl structure and the interface of the free layer 2 must be connected with good matching properties.

The interface layer 11 is inserted to further improve the lattice matching properties on the (100) plane of the spacer layer 4 made of the oxide layer having the NaCl structure. As the interface layer 11, it is preferable to select a material with which the lattice matching on the (100) plane of the spacer layer 4 is 5% or less, in order to form the Δ1 band.

(4) Pinned Layer

The pinned layer 3 will be explained in more detail below. In the following explanation, the pinned layer 3 includes the pinned layer 22.

The pinned layer 3 having perpendicular magnetization is preferably thicker than the free layer 2, and the product of the saturation magnetization Ms and a thickness t or the crystal magnetic anisotropic energy Ku is preferably much larger than that of the free layer 2. This is so in order to improve the spin accumulation effect in the pinned layer 3, i.e., to efficiently transfer the angular momentum from magnetization spins to conduction electrons, thereby minimizing the fluctuation of magnetization in the pinned layer 3 caused by spin transfer torque from the free layer 2.

When the pinned layer 3 has perpendicular magnetization, it is favorable to reduce a leakage magnetic field from the pinned layer 3. The leakage magnetic field from the pinned layer 3 interferes with magnetization reversal that changes the magnetization directions in the free layer 2 and pinned layer 3 from parallel to antiparallel by spin transfer torque. Accordingly, the apparent saturation magnetization Ms (net-Ms) of the pinned layer 3 is preferably as small as possible.

One method for the purpose is to give the pinned layer 3 a synthetic anti-ferro (SAF) structure. As shown in FIG. 10, the pinned layer 3 having the SAF structure has a stacked structure including a ferromagnetic layer 3a, spacer layer 3b, and magnetic layer 3c. The ferromagnetic layers 3a and 3c are formed to be stabilized by an antiparallel magnetization arrangement. An element such as Ru or Os is used as the spacer layer 3b.

Another method of reducing the leakage magnetic field from the pinned layer 3 having perpendicular magnetization is to form the pinned layer 3 by using a ferrimagnetic material. In this case, as shown in FIG. 11, the MR ratio is achieved by inserting an interface pinned layer 23 into the interface between the pinned layer 3 and spacer layer 4. A representative example of the ferrimagnetic material is an FeCo-RE material. Typical examples of RE are Gd, Tb, Dy, and Ho because they stabilize perpendicular magnetization. Te FeCo-RE alloy has an amorphous structure. When the RE composition of the FeCo-RE alloy is close to the compensation point, the saturation magnetization Ms becomes almost zero, the cause of the saturation magnetization Ms changes from FeCo to the RE element, and the coercive force Hc maximizes. Accordingly, the total apparent saturation magnetization net-Ms of the interface pinned layer 23 and pinned layer 3 can be set almost zero by making the content of the RE element larger than 50 at %. Note that the problems described in connection with the free layer 2 do not arise even when these materials are used in the pinned layer 3.

In the MR film 1 for spin transfer torque writing having perpendicular magnetization, it is favorable to produce a large difference in coercive force between the free layer 2 and pinned layer 3. The relationship between a coercive force $Hc_f$ of the free layer 2 and a coercive force $Hc_p$ of the pinned layer 3 is $Hc_p > Hc_f$. Also, as the product of the saturation magnetization Ms and the thickness t of the magnetic layer, the relationship between $Ms_p \cdot t_p$ of the pinned layer 2 and $Ms_f \cdot t_f$ of the free layer 3 is preferably $Ms_p \cdot t_p > Ms_f \cdot t_f$.

To give the pinned layer 3 sufficient unidirectionality, it is preferable to couple the pinned layer 3 with an antiferromagnetic layer by exchange coupling. Examples are combinations of antiferromagnetic alloy layers such as PtMn, FeMn, NiMn, PdMn, and IrMn and the pinned layer 3 made of an $L1_0$ structure alloy layer such as used as the free layer 2. The antiferromagnetic alloy layer and $L1_0$ structure alloy layer are coupled by exchange coupling. The lattice misfit between the antiferromagnetic alloy layer and the pinned layer 3 made of the $L1_0$ structure alloy layer is small. Therefore, the antiferromagnetic alloy layer can also function as an underlying layer for forming the pinned layer 3 having higher crystallinity, in addition to achieving the exchange coupling.

(5) Interface Layer

The interface layer will be explained in more detail below.

In the single pin structure, as shown in FIG. 2, the interface layer 11 can be formed between the spacer layer 4 and free layer 2. In the dual pin structure, as shown in FIGS. 6 to 8, it is possible to form one or both of the interface layer 11 between the spacer layer 4 and free layer 2, and the interface layer 13 between the spacer layer 21 and free layer 2.

The interface layers 11 and 13 are made of a ferromagnetic material containing an element selected from Fe, Co, and Ni as a main component. The "main component" means that an element as a main component is contained at a content of 50 at % or more.

The thickness of the interface layers 11 and 13 is 0.5 (inclusive) to 3.0 (inclusive) nm. If the thickness is less than 0.5 nm, the effect obtained by the insertion of the interface layers 11 and 13 cannot be obtained. If the thickness exceeds 3.0 nm, each layer of the MR element 1 cannot maintain perpendicular magnetization any longer.

The insertion of the interface layers 11 and 13 makes it possible to give the free layer 2 a magnetization arrangement as a ferromagnetic material in the interface between the spacer layers 4 and 21 made of, e.g., MgO and the free layer 2. This makes it possible to suppress the decrease in range rate of the MR ratio of the MR element 1. This is so because in a ferrimagnetic material, an element can take an antiparallel magnetization configuration even in the vicinity of the interface. More specifically, the effect is achieved when the surface of the free layer 2 is covered with a ferromagnetic material at a probability of 50% or more. Therefore, when made of only at least one element selected from Fe, Co, and Ni, the interface layers 11 and 13 need only be 0.5 ML (atomic layer) or more by using an atomic layer unit (ML: Mono Layer).

On the other hand, when 1 ML is regarded as the reference, the interface layers 11 and 13 must be made of a ferromagnetic material containing at least one element selected from Fe, Co, and Ni at a content larger than 50 at %. However, this definition holds when a substitutional element other than Fe, Co, and Ni is added. The addition amount of an invasive additive element such as B, C, or N can be neglected. Examples are $(Co_{1-Y}Fe_Y)_{100-X}B_X$, $Fe_{100-X}B_X$, and $Co_{100-X}B_X$.

The CoFeB film described above preferably has a composition that changes from the amorphous structure to the BCC structure by annealing after film formation. When the film immediately after the formation contains 15 (inclusive) to 30 (inclusive) at % of B, the CoFeB film immediately after the formation has the amorphous structure, and CoFe can be recrystallized by annealing after the film formation. In this case, the atomic composition ratio of Fe to Co is irrelevant. In the recrystallized CoFe, the BCC structure can be recrystallized regardless of the composition.

As described above, the upper limit of the thickness of the interface layers 11 and 13 is 3.0 nm. This is determined from the spin diffusion length of the interface layers 11 and 13 made of a ferromagnetic material. From the viewpoint of perpendicular magnetization, the perpendicular magnetization characteristics significantly deteriorate if the thickness of the interface layers 11 and 13 exceeds 3.0 nm.

The interface layer 11 mainly containing Fe, Co, or Ni preferably has the BCC structure in order to improve the lattice matching properties in the (100) plane when the interface layer 11 is formed on the spacer layer 4 made of the oxide layer having the NaCl structure. In this case, the interface layer 11 having the BCC structure is preferentially oriented in the (100) plane. The orientation relationship between the interface layer 11 having the BCC structure and the spacer layer 4 having the NaCl structure is as follows.

Plane relationship: NaCl structure layer (100)//BCC structure layer (001)
Orientation relationship: NaCl structure layer [100]//BCC structure layer [110]

The interface layers 11 and 13 having the BCC structure mainly containing Fe, Co, or Ni has a lattice constant of 0.288 nm±0.05 nm. This decreases the lattice matching with the (100) plane of the spacer layer 4 having the NaCl structure.

The results of verification on the effect of an interface layer made of Fe will be described below. An MR element having a stacked structure of $Fe_{40}Mn_{10}Pt_{50}$ [2 nm]/Fe [t nm]/MgO [1 nm]/Mg [0.4 nm]/CoFeB [3 nm] (each value in [ ] indicates the thickness, and a layer made of the material on the left side of "/" is formed on a layer made of the material on the right of "/") was formed. The dependence of the MR ratio of this MR element on the thickness t of the Fe interface layer was evaluated. Consequently, the MR ratio increased as the thickness of the Fe interface layer increased. An MR ratio of about 100% was obtained when the thickness t of the Fe interface layer was 2 nm. The MR ratio is independent of whether the easy magnetization axis is longitudinal or perpendicular. This demonstrates that the insertion of the interface layer increased the MR ratio.

As described above, in the magnetoresistive effect element according to the first embodiment, spin transfer torque reverses the magnetization configuration, and the free layer 2 contains the elements A, B, and C. This makes it possible to decrease the magnetization reversing current Ic and activation energy Ea while holding the state in which perpendicular magnetization of the free layer 2 is readily maintained. Consequently, it is possible to obtain a spin transfer torque writing type magnetoresistive effect element that is thermally stable and can reverse magnetization with a low electric current.

Second Embodiment

The second embodiment is directed to an MRAM using the MR element of the present invention.

A spin transfer torque writing type MRAM will be explained below.

Figure 12:
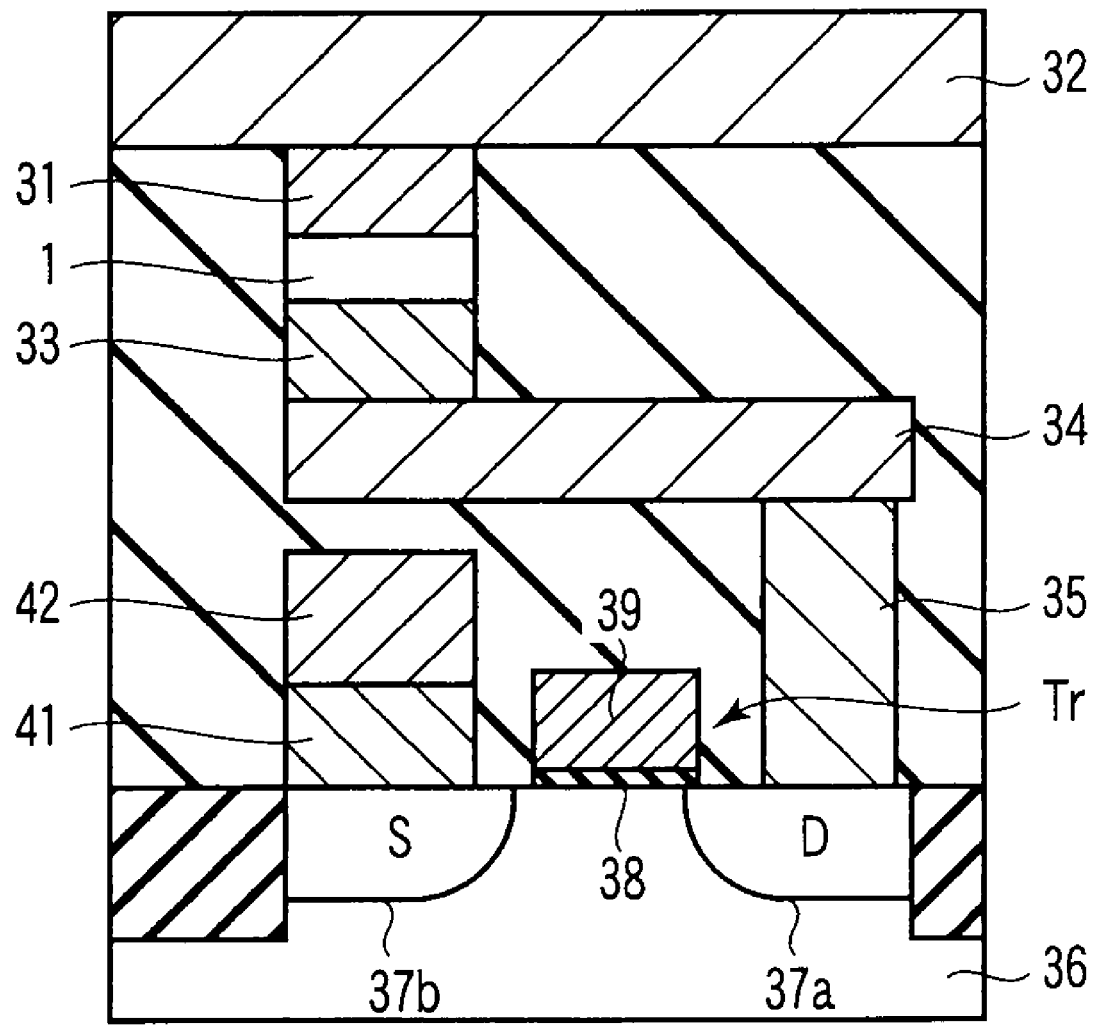
FIG. 12 is a sectional view showing the major components of a memory cell using an MR element according to a second embodiment of the present invention.

FIG. 12 is a sectional view showing the main parts of a memory cell of the MRAM according to the second embodiment of the present invention. As shown in FIG. 12, the upper surface of an MR element 1 is connected to a bit line 32 via an upper electrode 31. The lower surface of the MR element 1 is connected to a source/drain diffusion region 37a on the surface of a semiconductor substrate 36 via a lower electrode 33, conductive layer (extracting line) 34, and plug 35.

The source/drain diffusion region 37a forms a selection transistor Tr together with a source/drain diffusion region 37b, a gate insulating film 38 formed on the substrate 36, and a gate electrode 39 formed on the gate insulating film 38. The selection transistor Tr and MR element 1 form a memory cell of the MRAM.

The source/drain diffusion region 37b is connected to another bit line 42 via a plug 41.

Note that it is also possible to form the plug 35 below the lower electrode 33 without forming the extracting line 34, thereby directly connecting the lower electrode 33 and plug 35.

The bit lines 32 and 42, electrodes 31 and 33, conductive layer 34, and plugs 35 and 41 are made of, e.g., W, Al, AlCu, or Cu.

Figure 13:
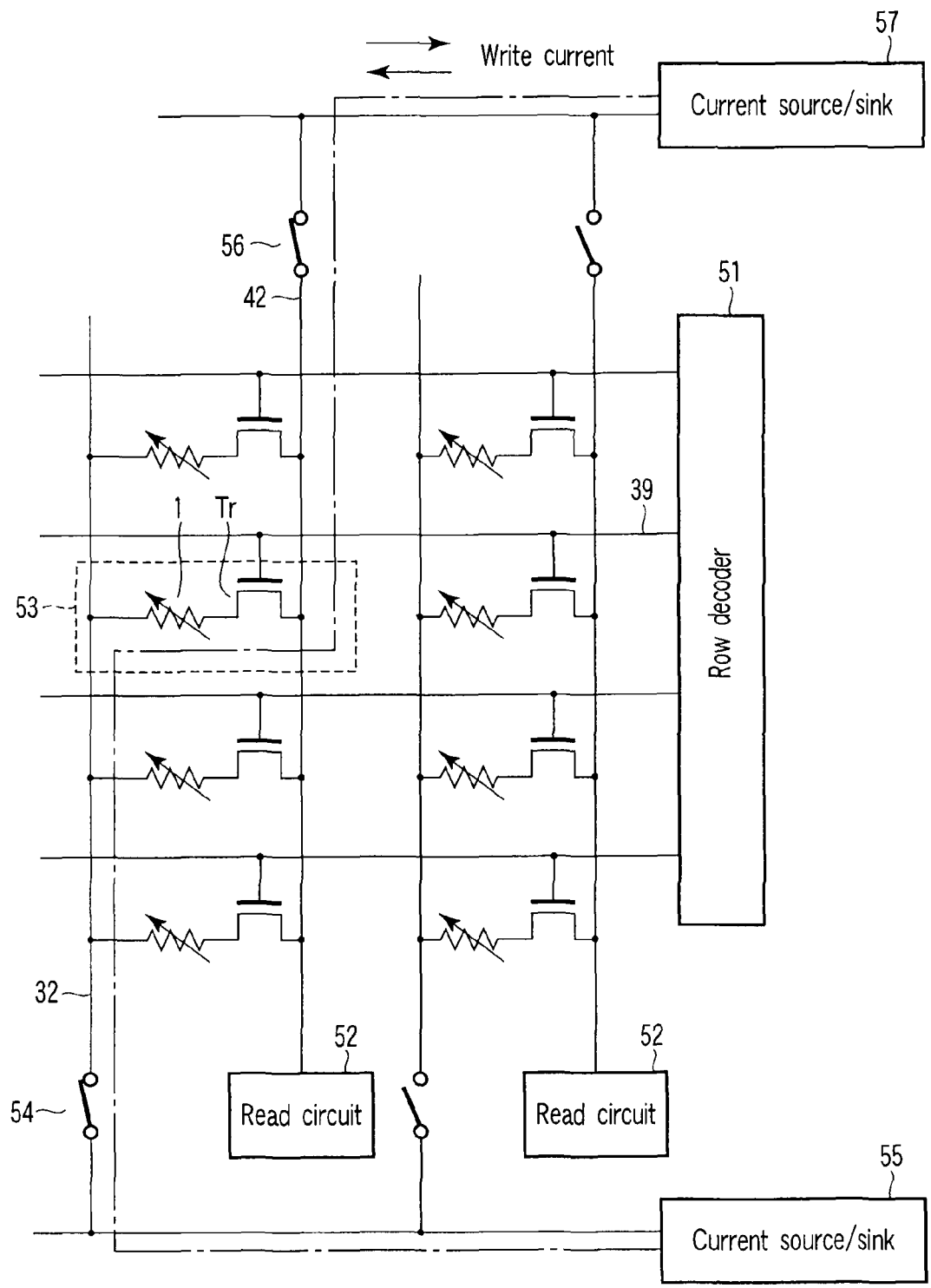
FIG. 13 is a circuit diagram of an MRAM using the MR element according to the second embodiment.

A memory cell array of the MRAM is formed by arranging a plurality of memory cells shown in FIG. 12 in a matrix or the like. FIG. 13 is a circuit diagram showing the major components of the MRAM according to the second embodiment of the present invention.

As shown in FIG. 13, a plurality of memory cells 53 each comprising the MR element 1 and selection transistor Tr are arranged in a matrix. The memory cells 53 in the same column each have one terminal connected to the same bit line 32 and the other terminal connected to the same bit line 42. The gate electrodes (word lines) 39 of the memory cells 53 in the same row are connected together and further connected to a row decoder 51.

The bit line 32 is connected to a current source/sink circuit 55 via a switching circuit 54 such as a transistor. The bit line 42 is connected to a current source/sink circuit 57 via a switching circuit 56 such as a transistor. The current source/sink circuits 55 and 57 supply a write current (reversing current) to the connected bit lines 32 and 42, or extract the write current from the connected bit lines 32 and 42.

The bit line 42 is also connected to a read circuit 52. The read circuit 52 may also be connected to the bit line 32. The read circuit 52 includes a read current circuit, sense amplifier, and the like.

When writing information, the switching circuits 54 and 56 and selection transistor Tr connected to a memory cell as an object of write are turned on to form a current path passing through the target memory cell. In accordance with the information to be written, one of the current source/sink circuits 55 and 57 functions as a current source, and the other functions as a current sink. Consequently, a write current flows in a direction corresponding to the information to be written.

The write speed is set such that spin transfer torque writing can be performed by an electric current having a pulse width of a few µs to a few µs.

When reading out information, the read current circuit supplies, to the MR element 1 designated in the same manner as in the write operation, a small read current that causes no magnetization reversal. The read circuit 32 compares a current value or voltage value caused by a resistance value corresponding to the magnetization configuration of the MR element 1 with a reference value, thereby determining the resistance state.

Note that the current pulse width in the read operation is desirably smaller than that in the write operation. This reduces write errors caused by the read current. This is based on the phenomenon that the smaller the pulse width of the write current, the larger the absolute value of the write current.

The second embodiment can provide a spin transfer torque writing type magnetoresistive random access memory that is thermally stable and can reverse magnetization by a low electric current, by using the magnetoresistive effect element of the first embodiment.

The embodiments of the present invention can provide a spin transfer torque writing type magnetoresistive effect element that is thermally stable and can reverse magnetization by a low electric current, and a magnetoresistive random access memory using the same.

Those skilled in the art can reach various changes and modifications within the spirit and scope of the present invention, so it is understood that these changes and modifications also belong to the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect element comprising:
a first magnetic layer having an invariable magnetization direction;
a second magnetic layer having a variable magnetization direction, and containing at least one element selected from the group consisting of Fe, Co, and Ni, at least one element selected from the group consisting of Ru, Rh, Pd, Ag, Re, Os, Ir, Pt, and Au, and at least one element selected from the group consisting of V, Cr, and Mn; and
a first spacer layer formed between the first magnetic layer and the second magnetic layer, and made of a nonmagnetic material,
wherein a bidirectional electric current flowing through the first magnetic layer, the first spacer layer, and the second magnetic layer makes the magnetization direction of the second magnetic layer variable.

2. The element according to claim 1, wherein a content of said at least one element selected from the group consisting of Ru, Rh, Pd, Ag, Re, Os, Ir, Pt, and Au is 30 (inclusive) to 70 (inclusive) at %.

3. The element according to claim 1, wherein a composition ratio of said at least one element selected from the group consisting of V, Cr, and Mn to said at least one element selected from the group consisting of Fe, Co, and Ni is not more than 1.

4. The element according to claim 1, wherein a portion of the second magnetic layer comprises an $L1_0$ ordered phase having an FCT structure.

5. The element according to claim 1, wherein the second magnetic layer is ferrimagnetic.

6. The element according to claim 1, further comprising:
a second spacer layer made of a nonmagnetic material, and formed on a surface of the second magnetic layer opposite from a surface facing the first spacer layer; and
a third magnetic layer having an antiparallel magnetization direction to the magnetization direction in the first magnetic layer, and formed on a surface of the second spacer layer opposite from a surface facing the second magnetic layer.

7. The element according to claim 1, further comprising a first interface layer formed between the second magnetic layer and the first spacer layer, and containing not less than 50 at % of at least one element selected from the group consisting of Fe, Co, and Ni.

8. The element according to claim 6, further comprising:
a first interface layer formed between the second magnetic layer and the first spacer layer,
a second interface layer formed between the second magnetic layer and the second spacer layer,
wherein the first and second interface layers containing not less than 50 at % of at least one element selected from the group consisting of Fe, Co, and Ni.

9. The element according to claim 7, wherein the first interface layer has a portion of BCC structure.

10. The element according to claim 7, wherein the first interface layer has a thickness of 0.5 (inclusive) to 3.0 (inclusive) nm.

11. The element according to claim 1, wherein the first magnetic layer and the second magnetic layer have magnetization substantially perpendicular to surfaces through which the first magnetic layer, the first spacer layer, and the second magnetic layer oppose each other.

12. A magnetoresistive random access memory comprising:
a memory cell array including a plurality of memory cells each including a magnetoresistive effect element cited in claim 1 as a memory element; and
a current supply circuit configured to bidirectionally supply an electric current to the memory cell.

13. A magnetoresistive effect element comprising:
a first magnetic layer having an invariable magnetization direction;

a second magnetic layer having a variable magnetization direction, and made of an MnAl alloy containing 30 (inclusive) to 70 (inclusive) at % of Mn, the second magnetic layer containing one of a ferromagnetic material and a ferrimagnetic material; and a first spacer layer formed between the first magnetic layer and the second magnetic layer, and made of a nonmagnetic material, wherein a bidirectional electric current flowing through the first magnetic layer, the first spacer layer, and the second magnetic layer makes the magnetization direction of the second magnetic layer variable.

14. The element according to claim 13, wherein the second magnetic layer made of MnAl contains at least one element selected from the group consisting of Fe, Co, and Ni at a composition ratio of not more than 1 to the Mn element.

15. The element according to claim 13, wherein the second magnetic layer contains at least one element selected from the group consisting of Ru, Rh, Pd, Ag, Re, Os, Ir, Pt, and Au at a composition ratio of not more than 1 to the Al element.

16. The element according to claim 13, wherein a portion of the second magnetic layer has an $L1_0$ ordered phase having an FCT structure.

17. The element according to claim 13, further comprising:
a second spacer layer made of a nonmagnetic material, and formed on a surface of the second magnetic layer opposite from a surface facing the first spacer layer; and
a third magnetic layer having an antiparallel magnetization direction to the magnetization direction in the first magnetic layer, and formed on a surface of the second spacer layer opposite from a surface facing the second magnetic layer.

18. The element according to claim 13, further comprising a first interface layer formed between the second magnetic layer and the first spacer layer, and containing not less than 50 at % of at least one element selected from the group consisting of Fe, Co, and Ni.

19. The element according to claim 17, further comprising:
a first interface layer formed between the second magnetic layer and the first spacer layer,
a second interface layer formed between the second magnetic layer and the second spacer layer,
wherein the first and second interface layers containing not less than 50 at % of at least one element selected from the group consisting of Fe, Co, and Ni.

20. The element according to claim 18, wherein the first interface layer has a portion of BCC structure.

21. The element according to claim 18, wherein the first interface layer has a thickness of 0.5 (inclusive) to 3.0 (inclusive) nm.

22. The element according to claim 13, wherein the first magnetic layer and the second magnetic layer have magnetization substantially perpendicular to surfaces through which the first magnetic layer, the first spacer layer, and the second magnetic layer oppose each other.

23. A magnetoresistive random access memory comprising:
a memory cell array including a plurality of memory cells each including a magnetoresistive effect element cited in claim 13 as a memory element; and
a current supply circuit configured to bidirectionally supply an electric current to the memory cell.

* * * * *